United States Patent [19]

Bobeck

[11] 4,007,447
[45] Feb. 8, 1977

[54] MAGNETIC BUBBLE, FIELD-ACCESS MEMORY HAVING OFFSET PROPAGATE ELEMENT DESIGN

[75] Inventor: Andrew Henry Bobeck, Chatham, N.J.

[73] Assignee: Bell Telephone Laboratories, Incorporated, Murray Hill, N.J.

[22] Filed: July 1, 1975

[21] Appl. No.: 592,175

[52] U.S. Cl. .................... 340/174 TF; 340/174 SR
[51] Int. Cl.[2] ........................................ G11C 11/02
[58] Field of Search ................ 340/174 TF, 174 SR

[56] References Cited

UNITED STATES PATENTS

| 3,832,701 | 8/1974 | Bobeck et al. | 340/174 TF |
| 3,925,769 | 12/1975 | George | 340/174 SR |

OTHER PUBLICATIONS

Evolution of Bubble Circuits Processed by a Single Mask Level, Bobeck et al; IEEE Trans. on Magnetics; vol. 9, No. 3; Sept. 1973; pp. 174–180.

*Primary Examiner*—Marshall M. Curtis
*Attorney, Agent, or Firm*—Herbert M. Shapiro

[57] ABSTRACT

A magnetic bubble, field-access memory with a relatively high packing density is achieved by offsetting the elements of one leg of a recirculating loop with respect to the elements of the other. Beneficial loop turn geometries are allowed also by the offset design.

6 Claims, 5 Drawing Figures

MAGNETIC BUBBLE, FIELD-ACCESS MEMORY HAVING OFFSET PROPAGATE ELEMENT DESIGN

FIELD OF THE INVENTION

Field of the Invention

This invention relates to magnetic memories and more particularly to such memories in which information is stored as patterns of magnetic bubbles.

BACKGROUND OF THE INVENTION

Magnetic bubble memories are now well known in the art. One mode of moving bubbles in a layer of bubble material employs a pattern of magnetic elements in a plane closely spaced with respect to and coupled to the layer of bubble material. The elements, in a most familiar form comprise a magnetically soft material, such as permalloy, but may also comprise ion implanted regions or grooves, etc. Successive portions of the elements become temporarily magnetized in response to a magnetic field rotating in the plane of the bubble layer in a manner to move bubbles along paths defined by the elements as is now well understood.

Frequently, the magnetic elements are organized to define closed loop paths for recirculating bubble patterns. In such closed loop paths, bubbles move clockwise or counterclockwise depending on the geometry of the elements and/or the direction of rotation of the field. In any case, bubbles move in one direction in one leg of the loop and in opposite direction in the other. To realize bubble movement of this type, elements in one leg are arranged symmetrically with respect to the elements in the other. Adjacent elements in a leg are spaced apart four bubble diameters, the legs being similarly spaced apart four diameters to avoid interaction between bubbles.

Bubble memories in which bubbles are moved by temporarily magnetized elements are usually organized in a manner where a plurality of closed loops recirculate bubbles through positions where transfer of information occurs on a controllable basis between the loops and an accessing channel. The requisite minimum separation of the legs of a loop determines a maximum packing density for a bubble layer of a specified size. Accordingly, a pattern of elements which permits the legs of a recirculating loop to be relatively closely spaced also permits an increased packing density.

BRIEF DESCRIPTION OF THE INVENTION

A relatively high packing density is achieved for a bubble memory by the placement of the elements of one leg of a recirculating loop in positions offset along the axis of propagation from the mirror image positions of the elements in the other leg. This offset placement allows for a closer spacing of the legs, a tight turn geometry for the loop, and a desirable magnetic pole configuration for sustaining bubbles at critical points during propagation.

In one embodiment, chevron-shaped elements are employed to define a closed loop for circulating a bubble. The chevrons in one leg of the loop are inverted from those in the other leg and offset with respect to one another so that apices of the chevrons in one leg align with the spaces between chevrons in the other.

DETAILED DESCRIPTION

Figure 1:
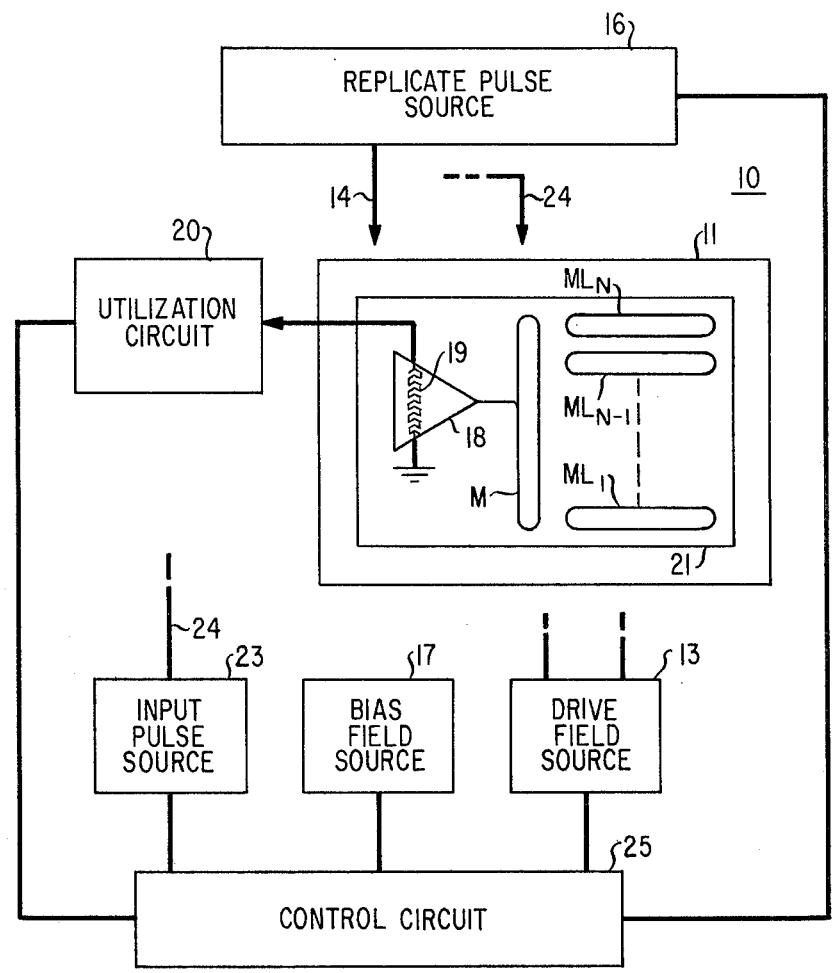
FIG. 1 is a schematic representation of a magnetic bubble memory.

FIG. 1 shows a magnetic bubble memory 10 including a film 11 of magnetic material in which single wall domains or bubbles can be moved. A plurality of magnetic elements 12 of FIG. 2 define closed loop paths or channels for recirculating bubble patterns in response to a magnetic field rotating in the plane of the film.

The usual organization for closed loop paths in a bubble memory is called the major-minor organization. In such an organization, a "minor" loop is arranged in parallel so that the turns of the loops are closely spaced with respect to associated stages of a "major" loop or channel. The minor loops are designated $ML_1$, $ML_2$ . . . $ML_{N-1} ML_N$ in FIG. 1. The major loop is designated M. The minor loops function as a permanent store where the information recirculates about the loops as the drive field rotates. A source of the drive field is represented in FIG. 1 by a block designated 13. An image of selected stored information is formed in the major loop, a bit from each minor loop, via a replicate conductor 14 coupled to the positions where the minor loops and the major loop are most closely spaced. Conductor 14 is pulsed by a pulse source represented by block 16. A bias field source represented by block 17 maintains bubbles in layer 11 at an operating diameter.

The information replicated in response to the "replicate" pulse moves to an expansion detector represented by triangular-shaped envelope 18, expands and passes detector 19. Detector 19, typically, is a magnetoresistance element responsive to the presence of a bubble to apply a signal to a utilization circuit represented by block 20. The information, so detected, passes through a familiar guard rail 21 and, effectively, is annihilated.

Information is replaced in memory by annihilating bits in the minor loops in a manner to leave vacancies thereon as is well known. An input pulse source 23 controllably pulses an input conductor 24 during each cycle of the drive field to generate a bubble pattern for placement into the vacancies in response to a latter pulse on conductor 14. The sychronization of the various circuits and sources is under the control of control circuit 25.

Figure 2:
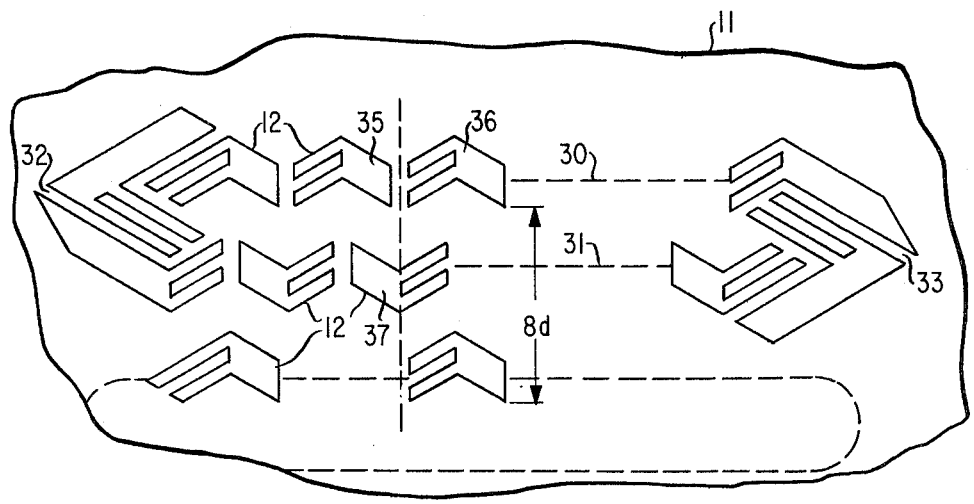
FIGS. 2, 3B and 4 are top views of portions of alternative magnetic bubble memories of the type shown in FIG. 1 showing the bubble path defining elements offset in accordance with this invention.
Figure 4:
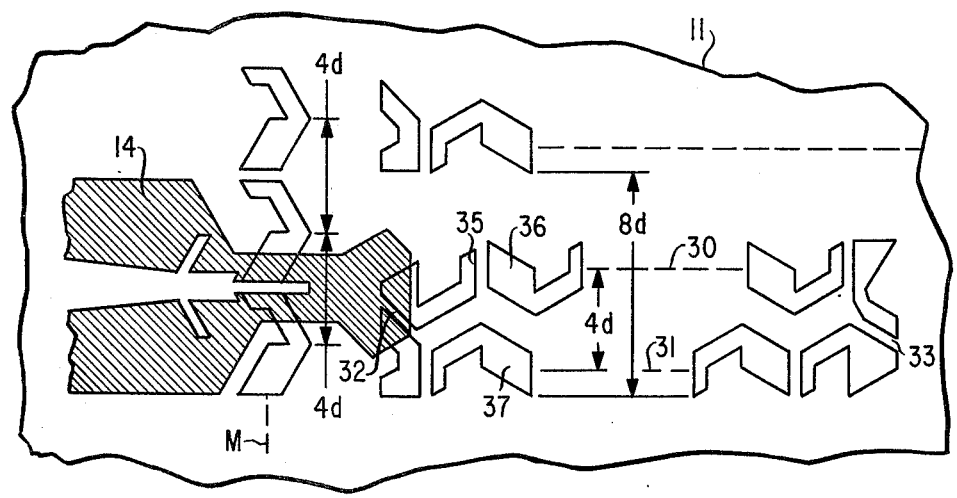

FIG. 2 shows details of one design of the elements 12 which define the various loops and channels of the memory. The specific shapes of the element chosen for illustrative purposes herein are those of asymmetric chevron designs. Similar asymmetric disc-shaped elements are disclosed in copending application Ser. No. 563,664 filed for P. I. Bonyhard, Yu-Ssu Chen and James L. Smith, Mar. 31, 1975. The illustrative elements may be thought of as straight-sided asymmetric disc (or chevron) which in one instance herein comprises one solid and one bifurcated end portion. The elements are aligned along an axis of propagation and define a recirculating loop including first and second legs 30 and 31 and turns 32 and 33 as indicated in FIGS. 2 and 4. It is important to note that the elements in leg 31 are offset with respect to the elements in leg 30 in accordance with this invention. Consider, for example, two elements 35 and 36 in leg 30 and note that the apex of element 37 in leg 31 is aligned with the spacing between elements 35 and 36.

The advantages achieved by offsetting the elements of the two legs are significant. They occur in three areas and add up to a significant increase in packing density. The first of these areas concerns generally the minimum separation between the legs of the minor loop. As was stated hereinbefore, the separation between elements in adjacent legs of a loop is about four-bubble diameters or eight bubble diameters separation between two like legs in adjacent loops. The eight-bubble diameter separation is realizable with T and bar-shaped overlay geometries but not with asymmetric geometries. The latter geometries require eight-bubble diameters plus the height of an element which is typically another two (or more) bubble diameters. By offsetting the asymmetric elements with respect to one another, an eight-bubble diameter spacing is again achieved. It is helpful to note at this juncture that the T and bar-shaped elements at the eight-bubble diameter spacing cannot be offset in accordance with this invention because a single bar is shared by adjacent legs in the T-bar design and thus requires registration of the elements of the legs with one another.

The second area of advantages relates to the fact that each element geometry has a weakest point at which a magnetic bubble is particularly vulnerable during propagation. The separations between elements are specified to minimize such vulnerability by spacing neighboring bubbles a distance to reduce bubble-bubble interaction so that operation over a satisfactory bias range is achieved. For a chevron element, an asymmetric chevron, or an asymmetric disc element, the most vulnerable point in the propagation sequence occurs when the bubble has crossed from one propagation element to a next subsequent element and thereafter moves along a portion of the subsequent element towards a peak of the element as the poles there become diffuse. In prior art patterns, where the propagation elements of one leg of a recirculating loop are mirror imaged from those in the other leg, a bubble enters a most vulnerable position, at a time when the neighboring poles are near and moving closer in a direction opposite to that of the "vulnerable" bubble. In other words, the vulnerability of a bubble at its most vulnerable point is increased by having close neighbors approach even more closely at that time. This vulnerability dictates minimum spacing of elements for achieving adequate margins.

An offset organization of elements, on the other hand, is operative to move neighbors to more remote positions just when a bubble is moving to a most vulnerable position in a propagation sequence. When a bubble is moving to a less vulnerable position, the neighbors are spaced more closely. The offset, accordingly, is most useful for element geometries which oscillate a bubble laterally with respect to an axis of movement.

Figure 3A:
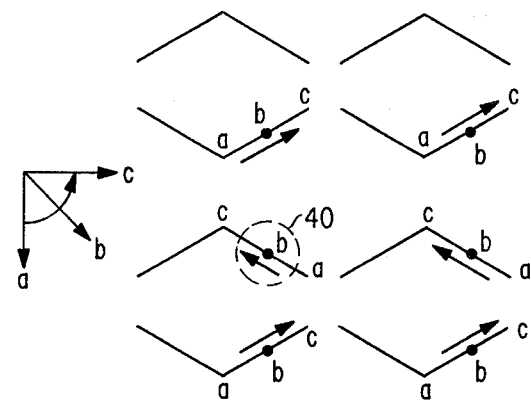
FIG. 3A is a top view of a portion of a prior art memory of the type shown in FIG. 1.
Figure 3B:
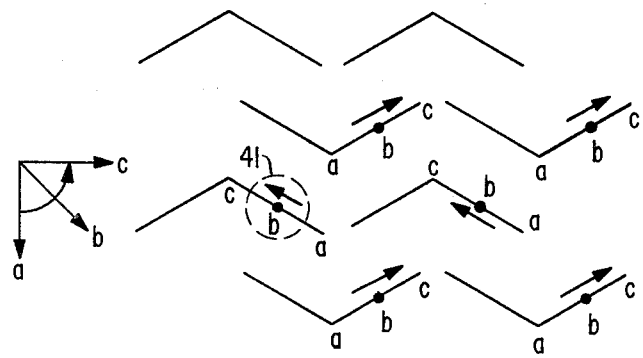

FIGS. 3A and 3B show chevron patterns, which are aligned and offset, respectively, in accordance with prior art teaching and in accordance with the present invention. As the drive field supplied by source 13 of FIGS. 1 reorients counterclockwise from direction $a$, through $b$ to direction $c$, a bubble moves in the direction shown by the arrows in FIGS. 3A and 3B. The bubbles are represented by darkened circles at positions $b$ and those bubbles in positions $b$ and moving towards an apex of an element are in most vulnerable positions. It can be seen that as a bubble moves into most vulnerable positions, neighboring bubbles are moving closer to it. On the other hand, from FIGS. 3B it can be seen that the neighboring bubbles are becoming more distant as a bubble moves into most vulnerable positions.

Consider, for example, the bubble in FIG. 3A encircled by broken circle 40. The bubble is moving from right to left and upwards as viewed. The bubbles immediately above and below that bubble are also moving upwards but towards the right. It is clear that the bubbles in positions $b$ are more closely spaced than they are when positions $a$ and $c$ are occupied. Equally significant is that as the bubbles enter positions $b$, the one enclosed by circle 40 is going in a direction opposite to that in which the remaining bubbles are going and is moving towards those bubbles, meeting an increasing repulsion force. Thus, the bubble in circle 40 is to some extent inhibited from reaching its position. The element spacing is determined by these considerations.

In contradistinction, the bubble encompassed by broken circle 41 of FIG. 3B is moving from its position $a$ upwards and to the left as viewed whereas the bubbles above and below it (when all bubbles are considered as occupying positions $a$) are moving upwards and to the right. Not only is the distance between these near neighbors increasing but the bubble in circle 41 is not meeting an increasing repulsion because it is heading away from its nearest neighbors.

The failure mode at position $b$, of asymmetric elements of the type considered, is at high bias levels where the bubble collapses at relatively low bias fields due to bubble-bubble interaction. More distant neighbors provide relatively little interaction. Consequently, an offset arrangement ensuring more distant neighbors at critical points during propagation exhibits higher margins which can be traded for closer spacings and thus higher packing densities.

A third area of advantages has to do with the turn geometry. There is less advantage to closely spaced legs for a recirculating loop if the turns of the loop occupy significantly large areas. Fortunately, with the offset arrangement, this is not the case. Quite to the contrary, the offset arrangement allows very tightly arranged turn geometries which define 180° turns for bubbles at either end of a loop with elements of one leg offset from those in the other. As can be seen from the asymmetric-chevron turn geometries of FIGS. 2 and 4, the elements at the turns fit comfortably within the (four diameter) space allocated without any enlargement of the loops. Adjacent loops, at eight diameter spacings, correspond conveniently to alternate stages of the major channels. Yet prior asymmetric element patterns require ten (or more) diameter spacings necessitating a spread out of the major channel geometries to correspond.

The offset of elements in one leg with respect to the position of elements in the associated leg of a recirculating loop can be understood to allow, particularly for asymmetric elements, the close spacings previously achieved for T and bar-shaped elements. The advantages are particularly clear in terms of elements which define an oscillating path rather than a straight path for a bubble. For example, the elements of FIGS. 2 and 4 move a bubble from the base of an element, over the peak of the element, and back to the base at the other end of the element. Clearly then, the elements move a bubble along an axis but in a path with a varying lateral displacement with respect to that axis. The displacement has a periodic maximum and the present arrangement places that periodic maximum displacement with respect to one leg in a position offset with respect to that of the other leg of a loop in a manner to allow a relatively small separation between the legs.

Although the advantages are clear with respect to asymmetric elements, an offset in a pattern of symmetric elements is also beneficial. For example, chevron elements without bifurcated end sections may be relatively closely spaced if offset in accordance with this invention.

What has been described is considered merely illustrative of the principles of this invention. Accordingly, various modifications thereof can be devised by those skilled in the art in accordance with those principles within the spirit and scope of this invention as encompassed by the following claims.

What is claimed is:

1. A magnetic device comprising a layer of material in which single wall domains can be moved, and means for moving domains along a path in response to a magnetic drive field reorienting in the plane of said layer, said means comprising a plurality of elements defining closed loop paths for said domains, each of said paths having first and second turns as well as first and second legs the latter being organized for moving domains in opposite directions, said device being characterized in that the elements in said first leg are offset along the axis of movement from the symmetrical positions of the elements in said second leg.

2. A magnetic device in accordance with claim 1 in which said elements are of a geometry operative to periodically vary the lateral displacement of domains with respect to the axis of said path as movement along said path occurs.

3. A magnetic device in accordance with claim 2 in which said elements are of chevron geometry.

4. A magnetic device in accordance with claim 2 in which said elements are of asymmetric geometry.

5. A magnetic device in accordance with claim 4 in which said elements are of an asymmetric chevron geometry.

6. A magnetic device in accordance with claim 3 in which each of said elements has a bifurcated end portion.

* * * * *